(12) United States Patent
Arimilli et al.

(10) Patent No.: US 8,754,546 B2
(45) Date of Patent: *Jun. 17, 2014

(54) BULK POWER ASSEMBLY

(75) Inventors: Ravi Kumar Arimilli, Austin, TX (US);
Edward Joseph Seminaro, Milton, NY (US); Kevin Robert Covi, Glenford, NY (US); Steven John Ahladas, Highland, NY (US)

(73) Assignee: International Business Machines Corporation, Armonk, NY (US)

( * ) Notice: Subject to any disclaimer, the term of this patent is extended or adjusted under 35 U.S.C. 154(b) by 1187 days.

This patent is subject to a terminal disclaimer.

(21) Appl. No.: 12/425,275

(22) Filed: Apr. 16, 2009

(65) Prior Publication Data
US 2010/0264733 A1  Oct. 21, 2010

(51) Int. Cl.
*H02J 1/00*  (2006.01)

(52) U.S. Cl.
USPC .................. 307/82; 307/65; 307/23; 307/24; 307/29

(58) Field of Classification Search
USPC .................................... 307/65, 82, 23, 24, 29
See application file for complete search history.

(56) References Cited

U.S. PATENT DOCUMENTS

| | | | |
|---|---|---|---|
| 4,035,716 A | 7/1977 | Hutchinson | |
| 4,074,182 A | 2/1978 | Weischedel | |
| 4,651,020 A | 3/1987 | Kenny et al. | |
| 4,766,364 A | 8/1988 | Biamonte et al. | |
| 5,790,394 A | 8/1998 | Cabaniss et al. | |
| 5,834,925 A | 11/1998 | Chesavage | |
| 6,031,298 A | 2/2000 | Lo et al. | |
| 6,191,499 B1 | 2/2001 | Severson et al. | |
| 6,195,754 B1 | 2/2001 | Jardine et al. | |
| 6,263,452 B1* | 7/2001 | Jewett et al. ................. 714/5.11 |
| 6,275,958 B1 | 8/2001 | Carpenter et al. | |
| 6,628,013 B2 | 9/2003 | Vogman | |
| 6,958,552 B2 | 10/2005 | Dodwon, III | |
| 7,274,114 B1 | 9/2007 | Wong | |
| 2002/0181249 A1 | 12/2002 | Coffey | |
| 2005/0116546 A1* | 6/2005 | Zeighami et al. ............... 307/51 |
| 2005/0185352 A1 | 8/2005 | Nguyen | |
| 2007/0097659 A1 | 5/2007 | Behrens et al. | |
| 2008/0040623 A1 | 2/2008 | Sone | |

FOREIGN PATENT DOCUMENTS

| | | |
|---|---|---|
| CN | 1217095 A | 5/1999 |
| CN | 201113779 Y | 9/2008 |
| GB | 1 360 270 A | 7/1974 |
| JP | 05236677 A | 9/1993 |
| JP | 08317644 A | 11/1996 |
| JP | 2000023356 | 1/2000 |

(Continued)

OTHER PUBLICATIONS

China Patent application 201080005855.3; Office action dated Jun. 27, 2013. (6 pg.).

*Primary Examiner* — Fritz M Fleming
(74) *Attorney, Agent, or Firm* — Yudell Isidore Ng Russell PLLC; Diana L. Roberts

(57) ABSTRACT

A bulk power assembly includes a bulk power distribution (BPD) subassembly and a bulk power controller and hub (BPCH) subassembly coupled to the BPD subassembly. The BPD assembly is configured to provide bulk DC power from both AC input power and DC input power. The BPD subassembly is configured to distribute the DC bulk power. The BPCH subassembly is configured to monitor and control the BPD assembly.

9 Claims, 8 Drawing Sheets

(56) References Cited

FOREIGN PATENT DOCUMENTS

| | | |
|---|---|---|
| JP | 2001306189 A | 11/2001 |
| JP | 2002034177 | 1/2002 |
| JP | 2003122459 A | 4/2003 |
| JP | 2003513606 A | 4/2003 |
| JP | 2006109682 A | 4/2006 |

* cited by examiner

BULK POWER ASSEMBLY

This invention was made with United States Government support under Agreement No. HR0011-07-9-0002 awarded by DARPA. The Government has certain rights in the invention.

CROSS-REFERENCE TO RELATED APPLICATIONS

The present application is related to commonly assigned U.S. patent application Ser. No. 12/425,267 now U.S. Pat. No. 8,018,095, entitled "POWER CONVERSION, CONTROL, AND DISTRIBUTION SYSTEM" by Ravi K. Arimilli et al., which was filed on even date herewith and is incorporated herein by reference in its entirety for all purposes.

BACKGROUND

1. Field

This disclosure relates generally to a power assembly and, more specifically to a bulk power assembly for providing power to a node (or a portion of a node) of a high performance computing cluster or other system requiring high-availability.

2. Related Art

Conventional high-availability systems (e.g., servers) have employed power supply redundancy in an attempt to prevent outages of the systems in the event a power supply fails. Unfortunately, power supply redundancy alone is frequently not sufficient to achieve one-hundred percent availability for a system.

SUMMARY

According to one aspect of the present disclosure, a bulk power assembly includes a bulk power distribution (BPD) subassembly and a bulk power controller and hub (BPCH) subassembly coupled to the BPD subassembly. The BPD assembly is configured to provide bulk DC power from both AC input power and DC input power. The BPD subassembly is configured to distribute the bulk DC power. The BPCH subassembly is configured to monitor and control the BPD assembly.

BRIEF DESCRIPTION OF THE DRAWINGS

The present invention is illustrated by way of example and is not intended to be limited by the accompanying figures, in which like references indicate similar elements. Elements in the figures are illustrated for simplicity and clarity and have not necessarily been drawn to scale.

DETAILED DESCRIPTION

Figure 1:
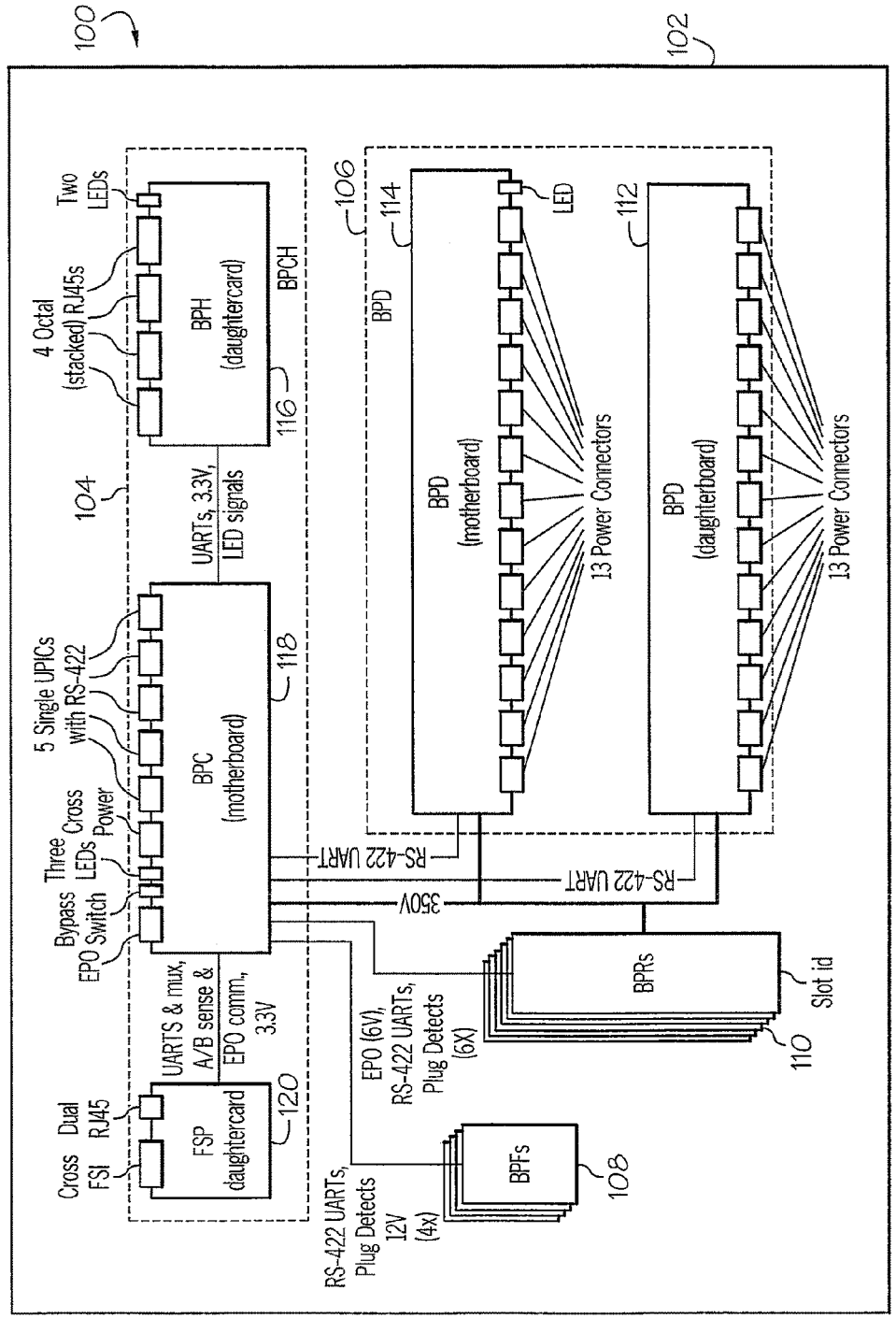
FIG. 1 is a diagram of a relevant portion of a bulk power assembly (BPA) configured according to various aspects of the present disclosure.

As will be appreciated by one of ordinary skill in the art, various portions of the present invention may be embodied as a method, system, device, or computer program product. Accordingly, aspects of the present invention may take the form of an entirely hardware embodiment, an entirely software embodiment (including firmware, resident software, microcode, etc.) or an embodiment combining software and hardware aspects that may all generally be referred to herein as a circuit, module, or system. The present invention may, for example, take the form of a computer program product on a computer-usable storage medium having computer-usable program code, e.g., in the form of one or more design files, embodied in the medium.

Any suitable computer-usable or computer-readable storage medium may be utilized. The computer-usable or computer-readable storage medium may be, for example, but is not limited to, an electronic, magnetic, optical, electromagnetic, infrared, or semiconductor system, apparatus, or device. More specific examples (a non-exhaustive list) of the computer-readable storage medium includes: a portable computer diskette, a hard disk, a random access memory (RAM), a read-only memory (ROM), an erasable programmable read-only memory (EPROM) or flash memory, a portable compact disc read-only memory (CD-ROM), an optical storage device, or a magnetic storage device. As used herein, the term "coupled" includes a direct electrical connection between elements or blocks and an indirect electrical connection between elements or blocks achieved using one or more intervening elements or blocks.

As used herein the term bulk power enclosure (BPE) refers to a sheet metal enclosure designed to hold modular components included in a bulk power assembly (BPA) or power conversion, control, and distribution system. In one or more embodiments, a BPE may be designed to accommodate the following modular subassemblies: one to six hot-swappable bulk power regulator (BPR) subassemblies that each generate −350 VDC from either AC input power or DC input power; a bulk power controller and hub (BPCH) subassembly that performs selected control/monitoring functions, distributes −350VDC via electronic circuit breakers, provides power control via a 32-port RS-422 multiplexer (MUX), and acts as a 34-port Ethernet switch for system service; a bulk power distribution (BPD) subassembly that is configured to distribute −350 VDC to external power devices via electronic circuit breakers; and four bulk power fan (BPF) subassemblies that remove heat load from air dissipated in the various subassemblies.

To support the subassemblies, the BPE may incorporate: a water manifold designed to accept system water inlet and outlet connections and distribute water as required to the subassemblies included in the BPE; an electromagnetic interference (EMI) filter for each power input to ensure line conducted noise of the BPA meets requirements; a pair of power inputs that attach to input line cords via detachable connectors; a backplane that interconnects signals and provides power for the subassemblies; guides and fasteners for mating all subassemblies into the BPE (and the BPE to a frame in a system application); and mechanical features to prevent air leakage during periods when BPR subassemblies are hot-swapped.

With reference to FIG. 1, an example BPA 100 is illustrated that includes a number of modular subassemblies within a BPE 102. The BPA 100 may, for example, be configured to provide up to 250 KW of power in a single rack. In this embodiment, electrical connections between a BPCH subassembly 104 and a BPD subassembly 106 and between the BPCH subassembly 104 and BPR subassemblies 110 are made via a backplane of the BPE 102. Electrical connections to the BPF subassemblies 108 are made from the BPCH subassembly 104 to the backplane of the BPE 102 and then from the backplane to each of the BPF subassemblies 108 through a cable assembly. In one embodiment, each pair of input power connectors (not shown in FIG. 1) supply input power to three BPR subassemblies 110. It should be noted that all output power and signals from the BPE 102 occur on a tailstock of either the BPCH subassembly 104 (signals & some power) or the BPD subassembly 106 (most of the power).

In a disclosed embodiment, nominal AC input voltages for the BPA 100 may include 200V, 208V, 220V, 240V, 380V, 400V, 415V, or 480V root-mean square (RMS). Steady-state AC input voltages may range from 176V to 508V. In various embodiments, the BPA 100 is configured for four-wire balanced three-phase system AC inputs. The BPA 100 is configured to connect to WYE (i.e., earthed, but unused neutral) and DELTA (i.e., earthed corner or center tapped phase) sources. Steady-state DC input voltages may range from 231VDC to 600VDC. DC inputs to the BPR subassemblies 110 are two potential (+ and −) lines plus earth. In various embodiments, the + line of the DC input is referenced to earth. In order to connect the two potential DC input conductors to a three-phase AC input, one of the DC potentials is connected to two of the phase inputs. In this case, the polarity of the input voltage is arbitrary (i.e., + and − may be connected to any of the phase inputs). A line filter may be implemented for each of the two power cords in the BPA 100 to ensure a fully populated BPE 102 meets applicable line conducted noise limitations.

BPR subassembly location pins may be provided to allow a BPR subassembly host microcontroller to identify what slot of the BPE 102 a BPR subassembly 110 is plugged into. A '0' on any of the pins is asserted by connecting the pin to the ground reference of the BPR subassembly host microcontroller (i.e., the plus rail of the BPR subassembly output). A '1' on the pin is asserted by leaving the pin open. Each of the two power input connectors may have an associated single LED that indicates sufficient input voltage is available to enable the BPR subassemblies 110 to start. In one embodiment, the single LED is illuminated if any one of the line-to-line input voltages is greater then 180VAC or 231VDC (i.e., the steady-state input operating range of the BPR subassemblies in this example). In one embodiment, the single LED is configured to be off if all of the line-to-line input voltages are less then 150VAC or 185VDC (the low line fault range for the BPR subassemblies in this example).

While the majority of heat dissipated in the subassemblies included in the BPE may be dissipated to water, forced air may be required to remove the remaining heat. In one embodiment, the forced air may be provided by four BPF subassemblies (speed controlled fan modules) located within the BPE. Each fan module may include two counter rotating fans. In general, the BPF subassemblies are configured to provide sufficient air flow to cool all subassemblies under all non-fault operating conditions. Under the condition that one of the fans has failed, the implemented fans should have sufficient capacity to cool all the BPR subassemblies at up to 75% of their rated output. In general, the electrical and mechanical design of the fans permits replacement of a failed fan while the BPA 100 is in service. In various embodiments, the design of the BPE 102 includes appropriate hardware to prevent air leakage and allow recirculation under conditions where one of the BPF subassemblies 108 has failed or has been removed from the BPE 102. Each of the BPF subassemblies 108 includes a microcontroller that has a serial interface that may be used to control fan speed and monitor the health of a respective BPF subassembly.

For example, a BPF microcontroller may include the follow connections: Tach; TachSel; PWMSpeed; Vfan; FanGood#; ID#; Xmit; and Rcv. In this case, Tach provides a pulse train from a fan output tachometer. The pulse train may have a duty cycle between 40 and 60% for non-fault operating conditions. The fan speed may, for example, be calculated as 15 RPMs for every rising edge per second. Fan operating speeds may, for example, range from 0 to 14,000 RPMs. TachSel is used to select which of two fan tachometers is connected to the tach input. PWMSpeed (which may be a 28.8 KHz pulse width modulated (PWM) waveform) is used to control the speed of both attached fans. For example, at a PWM duty cycle of '0' the fan speed is zero and at a duty cycle of 100% the fan speed is at a maximum. Vfan may correspond to the fan voltage divided by 4.00±2%. The Vfan signal may be, for example, passed through and low-pass filtered with a single pole at 600 Hz. When FanGood# is low, an LED may be lit to indicate a BPF subassembly is operational. When the ID# is low another LED may be driven to indicate when the BPF subassembly is operational in the BPE. The Xmit and Rcv pins may be implemented to form a full-duplex UART interface connection with a bulk power controller (BPC) motherboard 118. The interface may, for example, translate to an RS-422 protocol for connection to the BPCH subassembly 104.

Each BPF subassembly may provide a plug detect signal that indicates the fan is fully seated. The plug detect signal may be connected to the ground reference on the fan and run as a separate signal to the BPC motherboard 118. In at least one embodiment, when the BPF subassembly is not plugged, the BPC motherboard 118 pulls the plug detect signal to a high (i.e., not plugged) state. The BPA may be designed to operate at maximum load with an inlet temperature entering the BPA between 15° C. and 40° C. at an altitude of 0-10,000 ft. In at least one embodiment, the range for relative humidity is 20-80% non-condensing.

In one or more embodiments, none of the components that are included in the BPE 102 proper are water cooled. However, in this embodiment, the BPR subassemblies 110 and BPD subassembly 106 are water cooled. The BPE 102 includes the water manifold and connections to the BPR and BPD subassemblies. Cooling water temperature may range from about 13° C. to 24° C. In one embodiment, the water flow delivered to a fully configured BPE (e.g., including six of the BPR subassemblies 110 and one BPD subassembly 106) is about 3.5 gallons per minute at a pressure drop of 10 pounds per square inch (PSI). In one or more embodiments, deionized cooling water with 1000 parts per million (PPM), by weight, Benzotriazole™ is used. In various embodiments, system controls are designed to assure water temperature is non-condensing based on actual psychrometric conditions.

Figure 2:
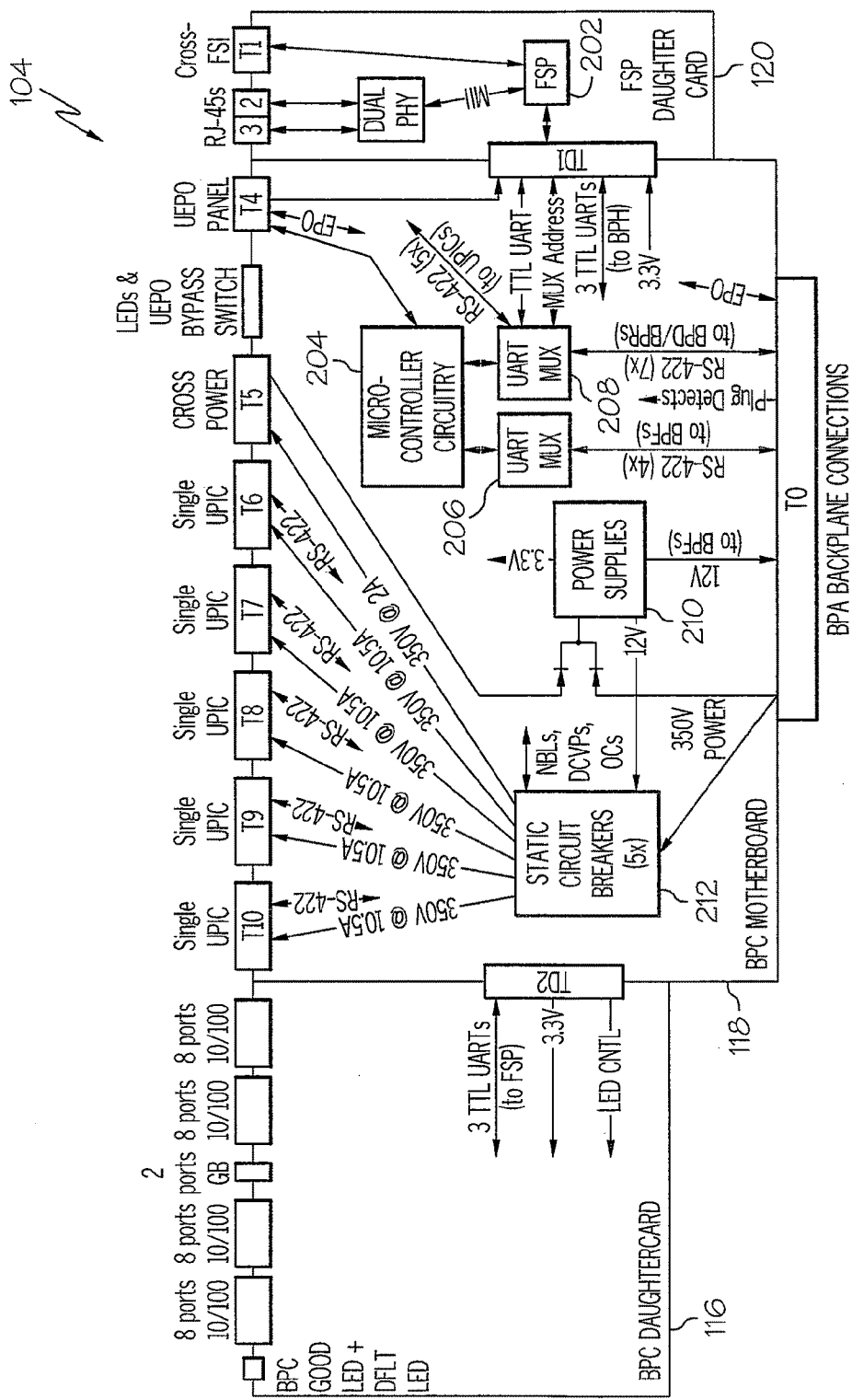
FIG. 2 is a diagram of a relevant portion of an example bulk power controller and hub (BPCH) subassembly that may be employed in the BPA of FIG. 1, according to various embodiments of the present disclosure.

As noted above, the BPCH subassembly 104 is part of the BPA 100. With reference to FIG. 2, the BPC motherboard 118 of the BPCH subassembly 104 includes static circuit breakers (SCBs) 212, which are used to control and distribute DC power. For example, five SCBs may be implemented in the SCBs 212. Bulk DC power (−350V) applied to the BPCH subassembly 104 is switched through different outputs by the SCBs 212, which provide relay and fault protection functions. The BPCH subassembly 104 includes power supplies 210 that provide various voltages required in the BPA 100. In a disclosed embodiment, the BPCH subassembly 104 controls and monitors four BPF subassemblies. The BPCH subassembly 104 also provides communication paths to associated output ports. The BPCH subassembly 104 also includes a flexible support processor (FSP) daughtercard 120 that provides system level processing and Ethernet communication functions. A bulk power hub (BPH) daughtercard 116 provides Ethernet hub functions. The BPCH subassembly 104 has no single points of failure in the circuitry providing BPF subassembly power and control. In one or more embodiments, the BPCH subassembly 104 also provides UEPO light-emitting diodes (LEDs), sensors, and connections that require 6V power, which is not required for operation of the BPCH subassembly 104.

The SCBs 212 perform the function of a circuit breaker, solid state relay, and in-rush control circuit. The SCBs 212 are designed to limit overloads by disabling a solid-state switch when output current exceeds a predefined threshold. A fuse may be attached to each of the SCBs 212 for backup protection. A scenario which would cause the backup fuse to open is abnormal as it requires both an overload on an output of the BPCH subassembly 104 and a failure of one of the SCBs 212 to current-limit the overload. In one or more embodiments, the fuse for each of the SCBs 212 is installed permanently in the BPCH subassembly 104 and is non-replaceable. A 12V bias for analog circuitry of the SCBs 212 is generated on the BPCH subassembly 104 and is referenced to −350VDC. The bus that provides the 12V bias may be protected by a fusible resistor at the SCB bias input. When one of the SCBs 212 is disabled, the rate at which the output voltage falls is dependent on the load impedance. In one or more embodiments, the SCBs 212 are turned on with a logical 'low' (−NBL) signal from the BPCH subassembly microcontroller 204. When the BPCH subassembly microcontroller 204 is reset, all SCB (−NBL) signals are 'high' disabling the SCBs. If one of the SCBs 212 latches off, the (−NBL) line must be toggled off, then on, to re-enable the SCB. The state of each SCB output voltage (−DCVP) is reported to the BPCH subassembly microcontroller 204. The SCB output voltage is 'low' when output voltage is present. Without +12V bias, the SCB output voltage line is 'high'. If an SCB latches off due to overcurrent, its (+OC) signal is 'high'. The signals are reported to the BPCH subassembly microcontroller 204. Without +12V bias, the (+OC) line is 'high'.

Figure 3:
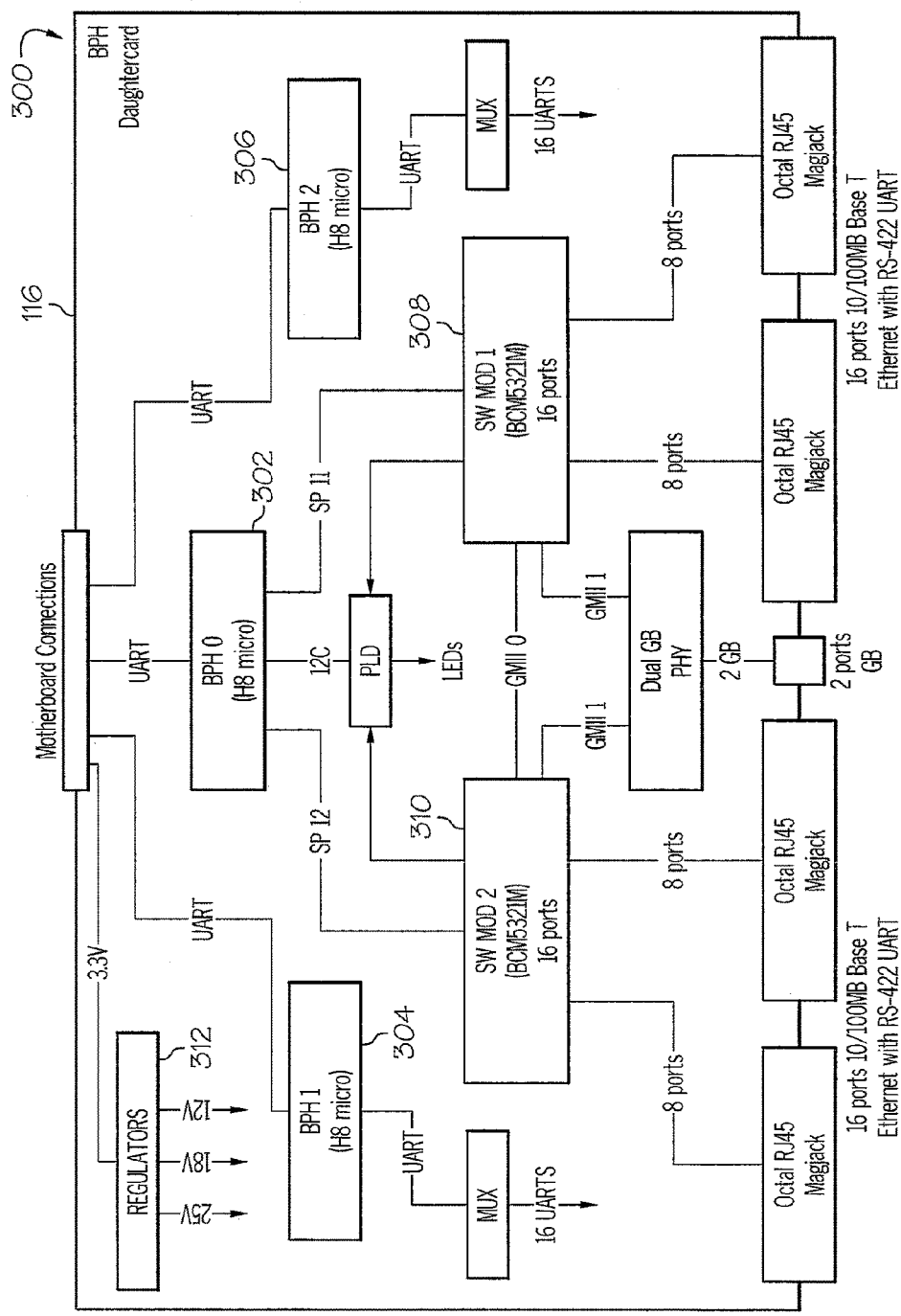
FIG. 3 is a diagram of a relevant portion of an example bulk power hub (BPH) daughtercard that may be employed in the BPCH subassembly of FIG. 2, according to various embodiments of the present disclosure.

In one embodiment, the BPH daughtercard 116 provides 32 10/100 MB/s Ethernet interfaces and 2 GB/s Ethernet interfaces. The BPH daughtercard 116 also provides thirty-two RS-422/RS-485 UART interfaces. Each 10/100 MB/s RJ-45 connector includes both types of interfaces (the 2 GB/S interfaces do not include RS-422/RS-485 UARTs). With reference to FIG. 3, in one embodiment, the BPH daughtercard 116 includes three microcontrollers 302, 304, and 306 (i.e., two for the UART communication and multiplexing and one for configuring and managing the Ethernet switch modules 308 and 310). In at least one embodiment, the BPH daughtercard 116 is virtual local area network (VLAN) configured.

The BPH daughtercard microcontroller 302 (BPH 0) configures the Ethernet switch modules 308 and 310 by via synchronous serial interfaces of the modules 308 and 310. Communication to the BPCH subassembly 104 is on serial interfaces from the FSP 202 on TD1 using a universal asynchronous receive/transmit (UART) protocol. In one or more embodiments, the interface levels are TTL compatible. The BPCH subassembly 104 also has an RS-232 serial interface on T4, which is utilized for UEPO communication and BPCH subassembly 104 testing. The interface is compatible with a properly configured personal computer COM (serial) port. The protocol for the TTL interface and the RS-232 interface is identical. In an embodiment, four UARTs are wired from the FSP daughtercard 120. These interfaces use TTL/CMOS (3.3V) levels.

The BPCH subassembly 104 provides a hardware multiplexer 208 for UART communication on one of the UARTs of the FSP 202. The multiplexer 208 allows the FSP 202 to select a port for communication. The FSP interface is TTL/CMOS (3.3V) compatible, but the BPCH subassembly 104 provides RS-422/RS-485 (differential, point-point) driver/receivers on all other ports. The multiplexer 208 has four address bits controlled by the FSP 202. The BPH daughtercard microcontrollers 304 and 306 (respectively labeled 'BPH 1' and 'BPH 2') are used for multiplexing RS-422/RS-485 UART interfaces. The BPH daughtercard microcontrollers 304 and 306 each provide sixteen RS-422/RS-485 UART interfaces, which may be half-duplex interfaces. The BPH daughtercard microcontrollers 304 and 306 provide direction control for the RS-422/RS-485 drivers. The BPC motherboard microcontroller 204 controls and monitors the BPF subassemblies 108 using multiplexed RS-422/RS-485 UART interfaces (via UART multiplexer 206).

The BPCH subassembly 104 includes an RS-422/RS-485 UART serial control interface for each of the four BPF subassemblies 108. These interfaces allow fan speed control and sensing. Each of the BPF subassemblies 108 is also provided protected 12V power from power supply 210. The BPCH subassembly 104 can enable/disable and sense each power output. The BPCH subassembly 104 includes power supplies that generate the following voltages from 350VDC input: +3.3V; +12V (SCB); +12V (BPF). Each of the four BPF subassemblies 108 provide current limiting and in-rush control for the +12V (BPF) voltage. Any BPF subassemblies 108 can be hot plugged/unplugged without disturbing the +12V (BPF) voltage to the other BPF subassemblies 108. A short on any one BPF subassemblies 108 does not affect the other BPF subassemblies 108 or the BPCH subassembly 104.

The power supplies 210 have the following protection and features: cross-powered 350V input; redundancy in that +12V (BPF) is generated with redundant circuitry for improved system availability; each redundant supply level is sensed by the BPC motherboard microcontroller 204; input current limiting in that a short in any BPCH subassembly bias supply does not disturb the −350VDC bus; the BPCH subassembly bias supplies are efficient and designed to minimize cooling requirements; the BPCH subassembly supplies do not start until the input voltage is over a set voltage; excessive voltage causes the supplies to disable switching as long as the over-voltage persists; and excessive BPCH subassembly board temperature causes the supplies to latch off.

The 6V UEPO power (used for the UEPO loop and panel) from the BPR subassemblies 110 is available independently from the BPCH subassembly bias power supplies. Once the UEPO loop is completed at power-up, the BPR assemblies 110 automatically enable the 350VDC to ensure that the BPCH subassembly power supplies start. If all 350VDC power is disabled, the system requires manual intervention to restart, because the FSP control logic is off. The 6V UEPO voltage from the BPR subassemblies 110 is sent to the UEPO switch connected to T4. The output is not over-current protected on the BPCH subassembly 104, as the BPCH subassembly 104 and FSP 202 are not powered from the 6V UEPO voltage. The BPCH subassembly 104 provides an RS-232 UART serial interface to the UEPO panel. This interface is also used during testing to send commands to the BPCH subassembly 104.

The UEPO panel provides the following sensing information to the BPCH subassembly 104: ambient temperature; humidity; barometric pressure; +UEPO power available; +room EPO complete/bypassed; and +UEPO complete. The BPCH subassembly 104 also supports the following panel functions directly: AB side sensing; FSP to FSP handshake signals; and a frame service LED. The BPCH subassembly 104 provides a UEPO bypass switch to allow concurrent maintenance of the UEPO panel and/or cable. When the switch is set to "bypass", the 6V UEPO loop is completed internally to the BPC motherboard 118. The maintenance can then be performed without affecting the 350VDC output from the BPR subassemblies 110. The BPC motherboard microcontroller 204 senses/controls: the −NBL, −DCVP, and +OC signals from each SCB; the −NBL, −DCVP, and −OC signals from each BPF power output; when BPR1-6 and BPF 1-4 are plugged; when UEPO (6V) power is available and UEPO is complete; when the UEPO panel is connected to T4; a bypass switch to concurrently maintain the UEPO panel/cable; and the 350V input from the T5 cross-power connector.

The BPC motherboard microcontroller 204 communicates with the UEPO panel and buffers the sensor information received. The BPC motherboard microcontroller 204 monitors the BPF subassemblies 108 and alters fan speed upon command from the FSP 202. The BPC motherboard microcontroller 204 also provides SCB status and enables/disables SCBs upon command from the FSP 202, provides BPF/BPR plug detect status, and provides bias sensing. The BPC motherboard microcontroller 204 stores code images for the UEPO panel and BPF subassemblies 108. After a successful power-on self-test, the BPC motherboard microcontroller 204 enables the BPCH subassembly 104 'good' LED. All SCBs are then disabled upon initial power-on (hardware reset). The BPC motherboard microcontroller 204 does not typically initialize fan speed of the BPF assemblies 108. The status of all BPC motherboard microcontroller 204 outputs is preserved during and immediately after code download. The BPH daughtercard microcontroller 302 continually validates the VLAN configuration of the switch modules 310 and 312 by reading the configuration registers and comparing the values against a table stored in flash associated with the microcontroller. This ensures the security of the network and checks for a reset condition of the switch modules which will have these registers cleared if a reset takes place.

The status of the port links are continually checked. If a link is found to appear or disappear, a 'link status change' flag and corresponding mask are set for a network manager to pick-up. Upon receiving an appropriate FSP command, the BPH daughtercard microcontroller 302 can alter an LED status for any port. The BPH daughtercard microcontroller 302 provides bias sensing for regulators 312. In one embodiment, upon boot, the BPH daughtercard microcontroller 302 first checks that the switch modules 308 and 310 are being held in reset to ensure that the hub is never in an 'open network' configuration. The default VLAN configuration, which is stored in flash, is loaded into the switch modules 308 and 310. Then port forwarding is enabled on all available ports. The BPH daughtercard microcontroller 302 then enables the control flags for the port link monitor functions.

Figure 4:
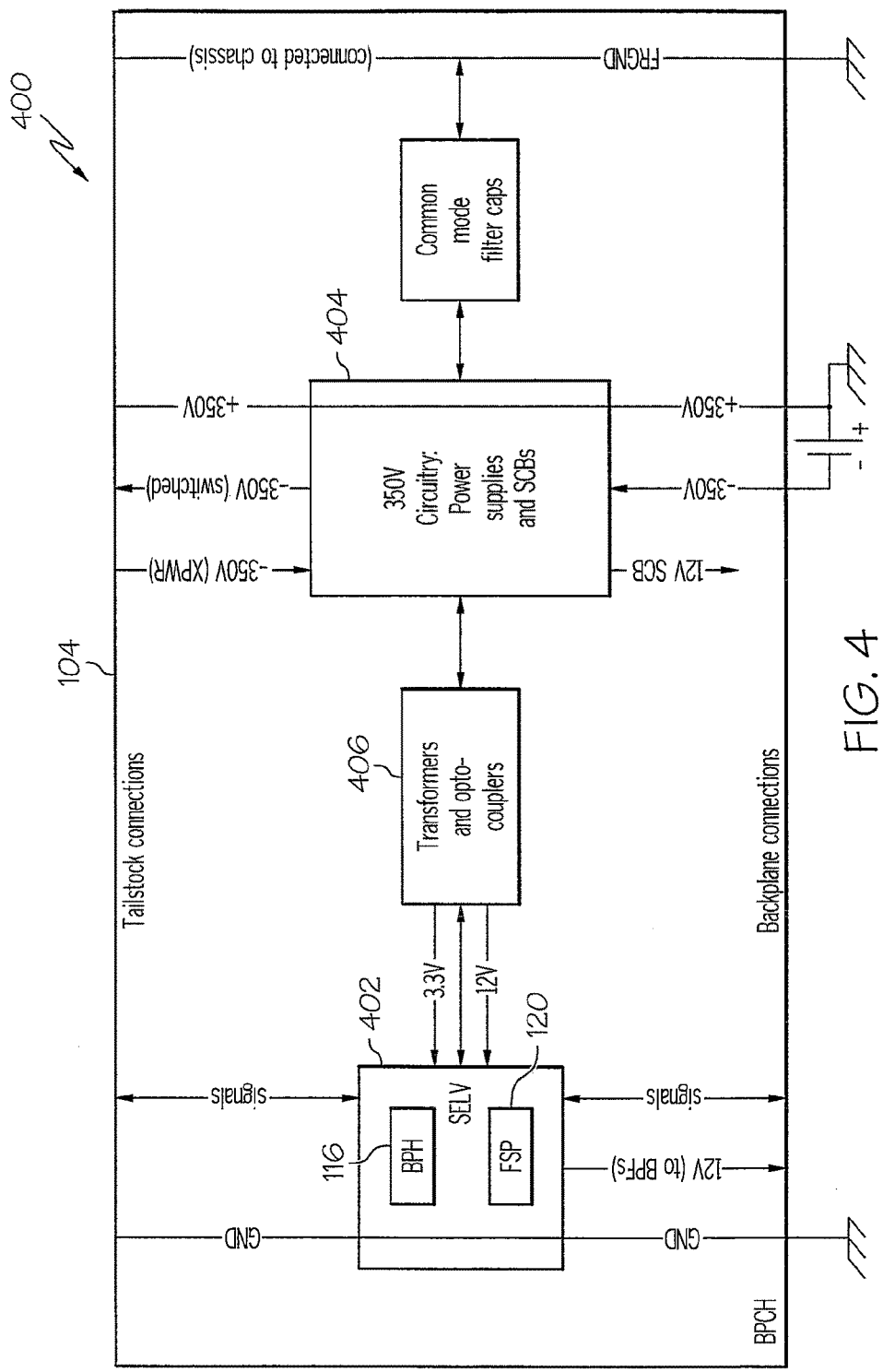
FIG. 4 is a diagram of a relevant portion of another example BPCH subassembly that may be employed in the BPA of FIG. 1, according to various embodiments of the present disclosure.

With reference to FIG. 4, a diagram 400 illustrates that the BPCH subassembly 104 includes an SELV block 402 that includes the BPH daughtercard 116 and the FSP daughtercard 120. The SELV block 402 is coupled to 350V circuitry 404 with transformers and opto-couplers 406.

Figure 5:
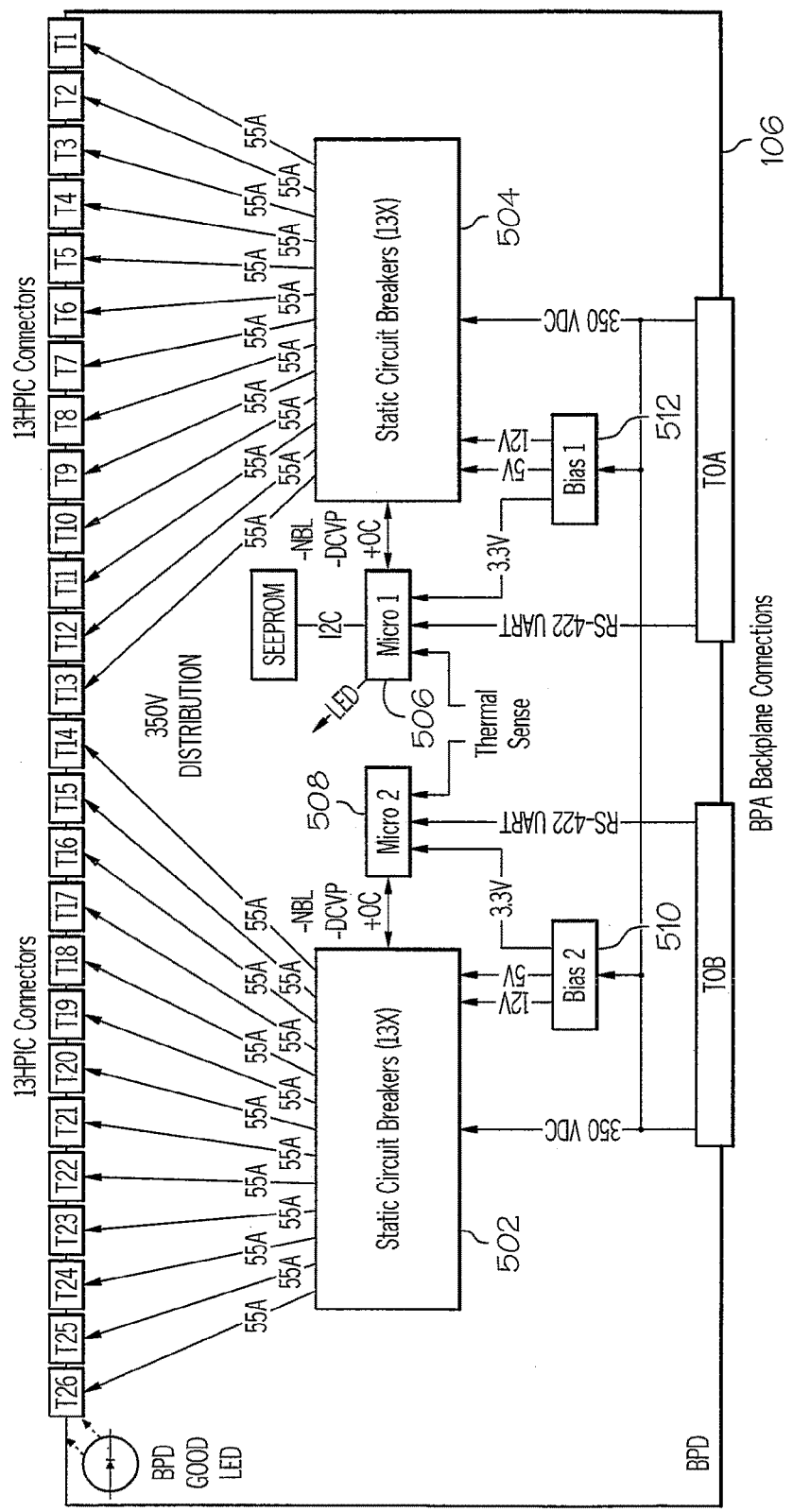
FIG. 5 is a diagram of a relevant portion of an example bulk power distribution (BPD) subassembly that may be employed in the BPA of FIG. 1, according to various embodiments of the present disclosure.

With reference to FIG. 5, the BPD subassembly 106 includes SCBs 502 and 504, which are used to control and distribute DC power. In a disclosed embodiment, bulk DC power (350V) applied to the BPD subassembly 106 is switched through 26 different outputs (T1-T26) by the SCBs 502 and 504, which provide relay and fault protection functions. In this embodiment, the BPD subassembly 106 executes commands that initiate from the BPC motherboard 118 and does not perform any independent control function. For example, the commands provided to the BPD subassembly 106 include enabling/disabling SCBs 502 and 504 and querying status of the SCBs 502 and 504. In the disclosed embodiment, the BPD subassembly 106 has two independent microcontrollers 506 and 508 that each sense one-half the SCBs 502 and 504. In this manner, any microcontroller failure does not disable all of the BPD subassembly 106. The BPD subassembly 106 has two independent 3.3V/12V bias supplies 510 and 512. Each of the bias supplies 510 and 512 supply power to one of the microcontrollers 506 and 508 and one of the SCBs 502 and 504. In this manner, any bias supply failure does not disable the entire BPD subassembly 106. The 3.3V bias, 5V bias, 12V bias, SCB controls, and microcontroller circuitry are all referenced to 350V(−). The RS-422 interface to the BPC motherboard 118 is designed as a safety extra low voltage (SELV) interface to optically isolate the interface from the BPD subassembly 106.

The SCBs 502 and 504 in the BPD subassembly 106 function as circuit breakers, solid state relays, and in-rush control circuits. The SCBs 502 and 504 are designed to limit overloads by disabling a solid-state switch when output current exceeds a predefined threshold. Each of the SCBs may have an associated fuse for backup protection. A scenario that would cause the backup fuse to open is abnormal as it requires both an overload on an output of the BPD subassembly 106 and an SCB failure to current-limit the overload. In at least one embodiment, the fuse is installed permanently in the BPD subassembly 106 and is non-replaceable. When an SCB is disabled, the rate at which the output voltage falls is dependent on the load impedance.

The SCBs 502 and 504 are turned on with a logical 'low' (−NBL) signal from an associated one of the microcontrollers 506 and 508. When one of the microcontrollers 506 and 508 is reset, all associated −NBL signals are 'high' disabling the associated SCBs. If an SCB latches off, the −NBL line is toggled off, then on, to re-enable the SCB. The state of each SCB output voltage (−DCVP) is reported to an associated one of the microcontrollers 506 and 508. The SCB output voltage is 'low' when output voltage is present. Without +12V bias, the SCB output voltage line is 'high'. If an SCB latches off due to over-current, its (+OC) signal is 'high'. These signals are reported to an appropriate one of the microcontrollers 506 and 508. Without +12V bias, the (+OC) line is 'high'.

Figure 6:
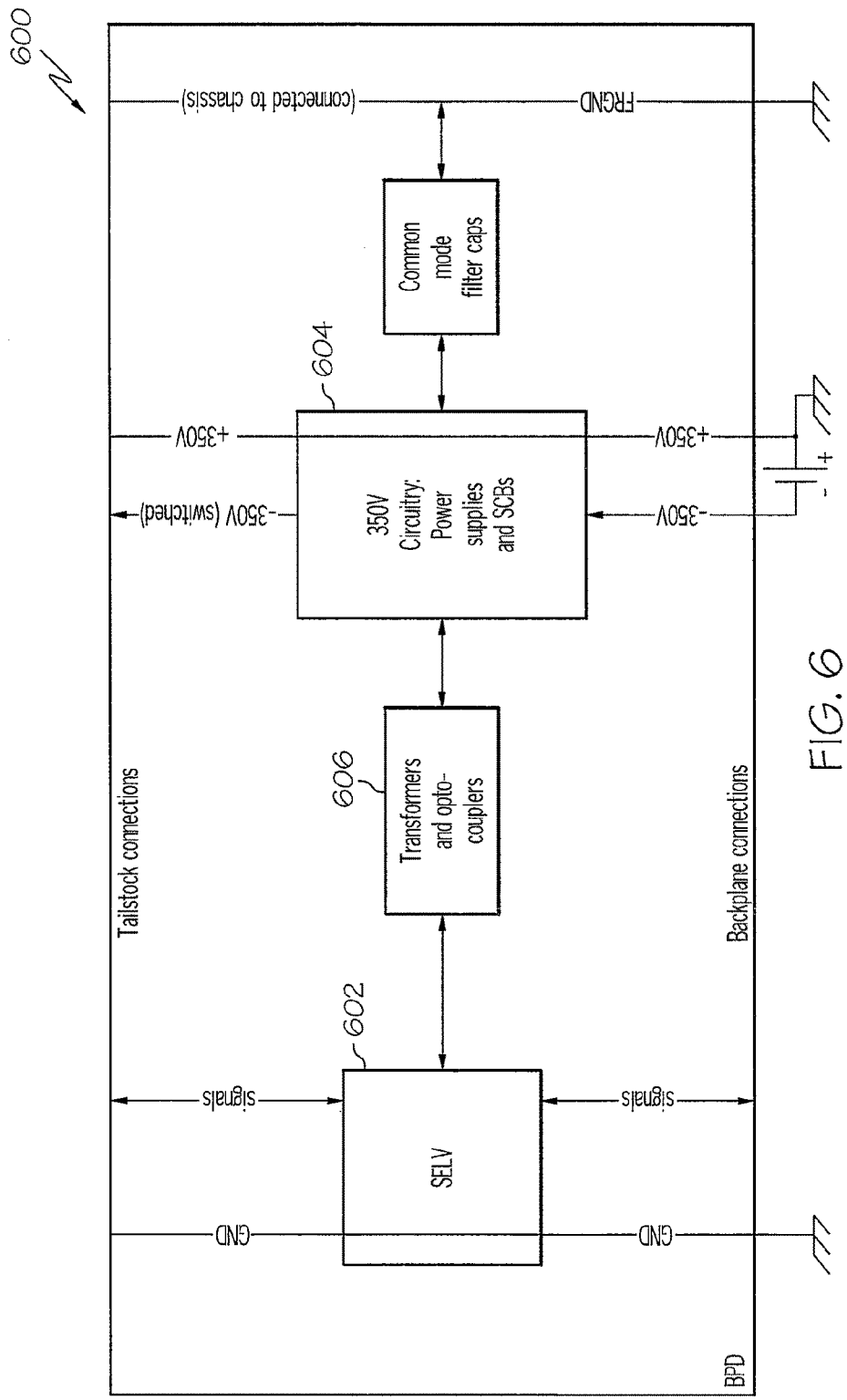
FIG. 6 is a diagram of a relevant portion of another example BPD subassembly that may be employed in the BPA of FIG. 1, according to various embodiments of the present disclosure.

Communication to the BPD subassembly 106 is on serial interfaces from the BPC motherboard 118 on TOA/TOB. In one or more embodiments, the protocol on the interface is a UART protocol and the interface levels are RS-422 compatible. The bit transmission rate on the interface may be, for example, 115.2 KBaud. In one embodiment, the BPD subassembly 106 has a single LED to indicate when the BPD subassembly 106 is good. The single LED is used for identification when replacing a BPD subassembly 106. Each of the microcontrollers 506 and 508 also provides thermal protection for the BPD subassembly 106. In one or more embodiments, the SCBs 502 and 504 are disabled if an associated cold plate is too hot. In general, the bias supplies 510 and 512 are configured to protect themselves from insufficient airflow. After a successful power-on self-test, the microcontroller 506 enables the BPD good LED. All SCBs 502 and 504 are disabled upon initial power on (hardware reset). The microcontrollers 506 and 508 may be the same or different. With reference to FIG. 6, a diagram 600 illustrates that the BPD subassembly 106 includes an SELV block 602 that is coupled to 350V circuitry 604 with transformers and opto-couplers 606.

According to various aspects of the present disclosure, the BPR subassembly 110 is configured to: provide a regulated −350 VDC isolated output to the BPCH subassembly 104 and BPD subassembly 106; draw low harmonic low noise power factor corrected input power; provide a line regulated standby voltage of 6V to the BPCH subassembly 104 and system emergency power off (EPO) loop; provide an EPO mechanism via an internal relay; and monitor a number of internal signals with microcontrollers to access the health of itself and provides this information via a serial link. The high power levels of the BPR subassembly 110 are achieved through a modular arrangement of smaller power converter stages.

Figure 7:
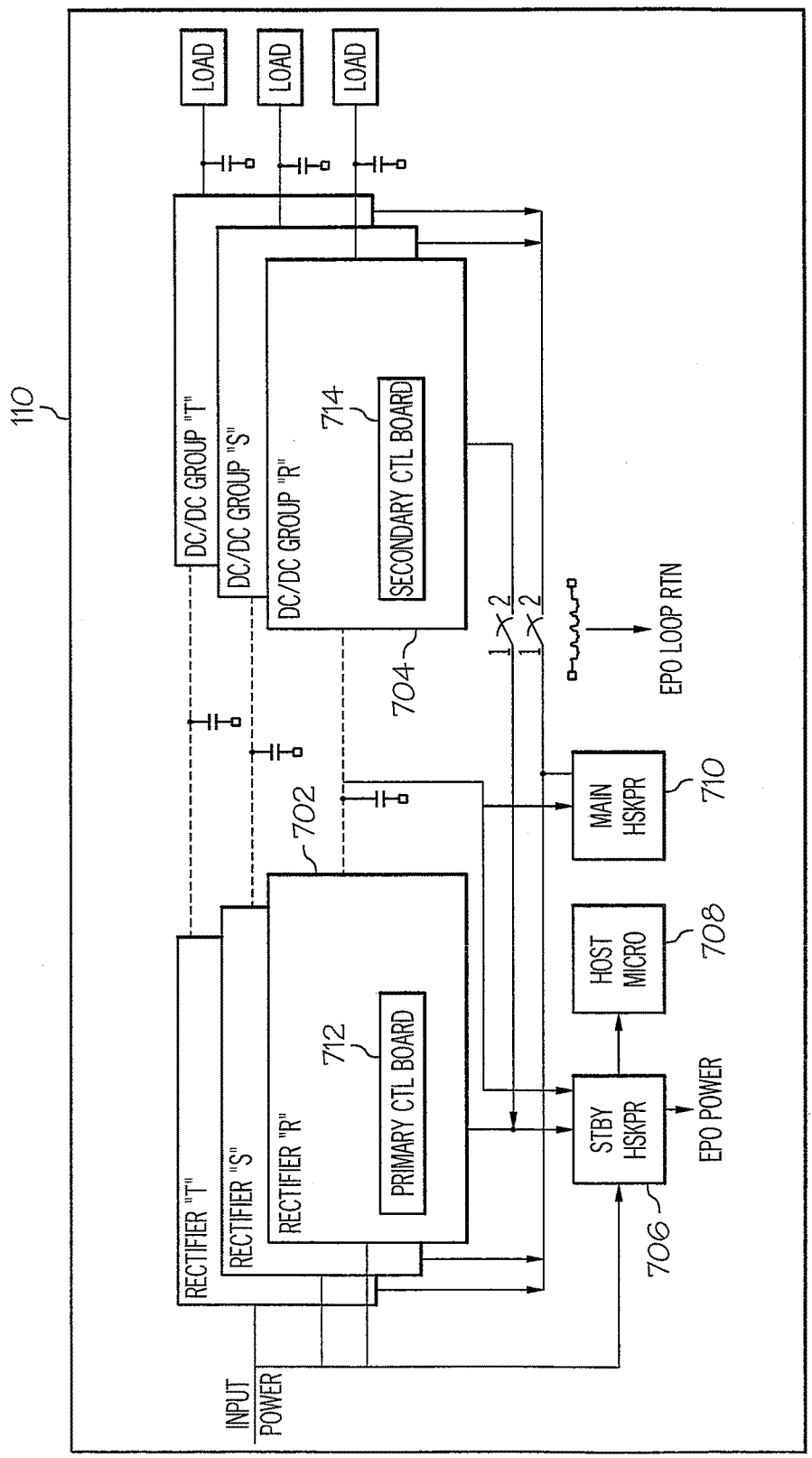
FIG. 7 is a diagram of a relevant portion of an example bulk power regulator (BPR) subassembly that may be employed in the BPA of FIG. 1, according to various embodiments of the present disclosure.

With reference to FIG. 7, each of the BPR subassemblies 110 include three electrically identical power converter sections denoted by the letters R, S, and T. Each of the sections includes a rectifier front-end 702 and a group of DC/DC converters 704 that are commoned together to form an output power bus. Each of the sections has no dependency on the other two sections. That is, a failure in one section does not prevent the other two sections from operating. A standby housekeeping power supply (labeled 'STBY HSKPR') 706 provides power to the control circuits for rectifier R and DC/DC converter group R when power is applied to an input of the BPR subassembly 110. Once rectifier R is started, the standby housekeeping power supply 706 bootstraps its input power feed to the output of rectifier R. A host microcontroller 708, which is powered from the standby housekeeping power supply 706, may then start the main housekeeping power supply (labeled 'MAIN HSKPR") 710.

The main housekeeping power supply 710 receives input power from the output of rectifier R and powers the controls for the remainder of the BPR subassembly 110. A relay is used to allow the −350V output to be enabled by providing needed operating bias to the DC/DC converter control circuitry. The relay also serves as a UEPO loop function. When the relay is not activated all DC/DC converter controls mechanically have their bias removed. This prevents the output of the DC/DC converter from being active for cases where safety power removal is necessary. The BPR subassembly 110 'BPR Good' signal is turned on when the bias is activated and the output is enabled.

A BPR subassembly may be configured with an on/off slide switch with a mechanical interlock to ensure that the BPR subassembly is always installed or removed in a disabled condition. In order to enhance current sharing on the input and output connectors between the three rectifiers and three groups of DC/DC converters, the three-phase input connections and DC output connections for each of the power converter stages may have there own dedicated set of pins. The BPR subassembly 110 includes a host and six ancillary microcontrollers (one for each rectifier and DC/DC converter group).

Figure 8:
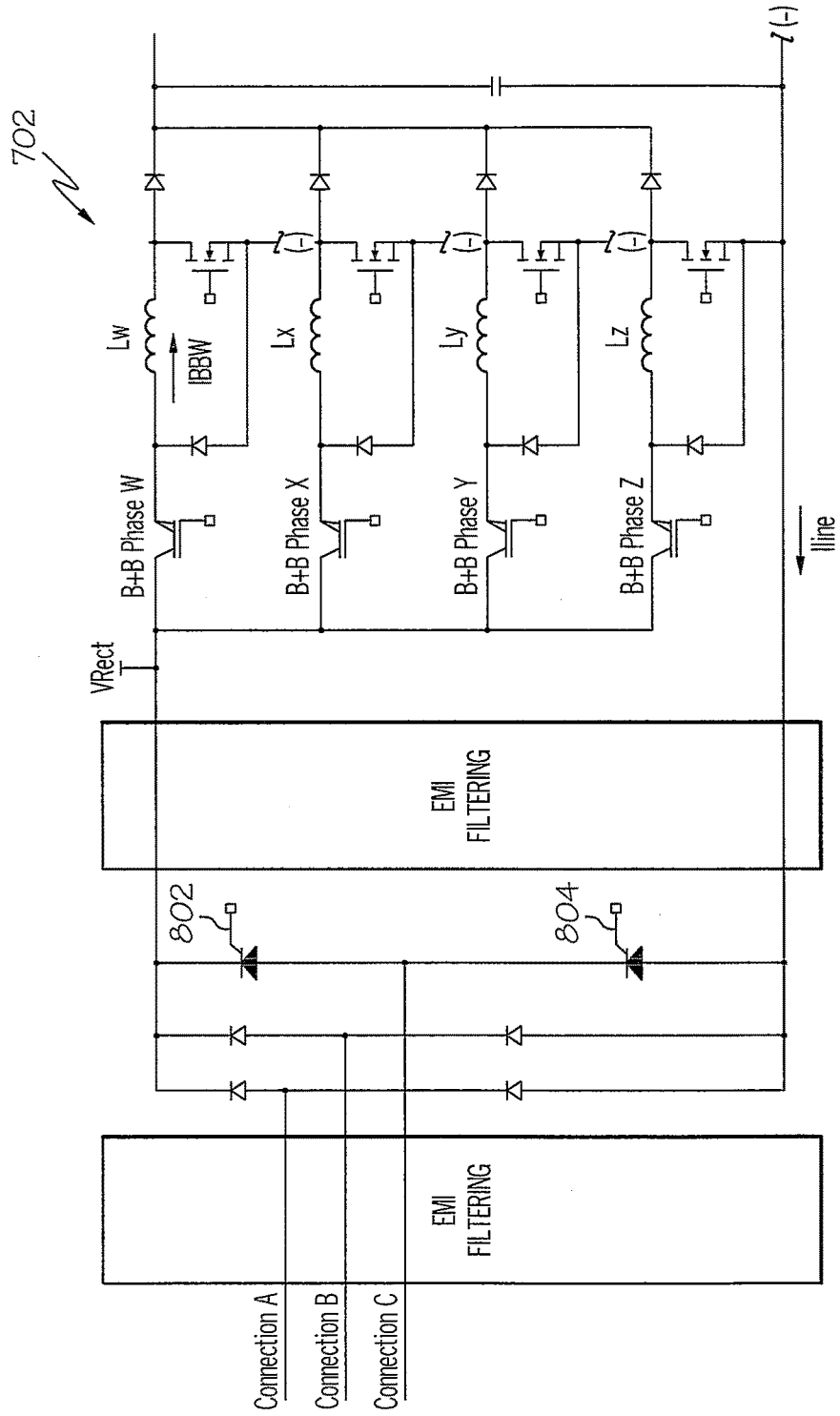
FIG. 8 is a diagram of a relevant portion of an example rectifier front-end that may be employed in the BPR of FIG. 7, according to various embodiments of the present disclosure.

With reference to FIG. 8, each rectifier 702 includes a single phase AC/DC converter whose control circuits perform resistive emulation (i.e., sinusoidal unity power factor input currents) for AC inputs. The rectifier switching power stage is a buck+boost converter with four interleaved sections, denoted as sections W, X, Y, and Z. Each of the single phase rectifiers is connected to the third phase of the AC input line to provide increased immunity to power line disturbances. Under normal operation, no current flows on connection C. When required, the single phase input diode bridge connected to connections A and B becomes a three-phase diode bridge that includes connection C (by firing a pair of SCRs on connection C). The three rectifier sections are alternately connected to the three-phase input line to provide a nominally balanced three-phase DELTA input, with one rectifier operating between any one line-to-line voltage of the AC input. Since each of the three rectifiers nominally operate from a different pair of line voltages, the (−) output of each rectifier is not common.

Input power to the BPR subassemblies 110 is provided from the backplane of the BPE 102. For example, one slightly longer input pin per phase may be implemented to engage AC first when a BPR subassembly 110 is plugged into the backplane. In this case, the pins are then paralleled with the remaining pin of the phase when the BPR subassembly 110 is completely seated. In a typical implementation, an initial contacting pin/socket is configured to handle any arcing damage.

Connected to the output of each of the rectifiers is a group of DC/DC converters (e.g., a group may include four DC/DC converters) that generate a regulated output voltage and also provide galvanic isolation from the input line. The four DC/DC converters in a given group are referred to herein as W, X, Y, and Z. Each output of the DC/DC converters includes an ORing diode, which prevents a fault on one output section from bringing down the parallel converters. In one embodiment, DC/DC converters in the same group share a common voltage error signal, which forces all of the converters to operate at the same output current.

The BPR subassembly worst case maximum in-rush current per any phase at the initial application of AC is composed of input capacitor charging current. In various implementations, the charging current will not exceed 100 A peak with a pulse width of 200 uS and is dependent on the input source impedance. When the BPR, subassembly is turned on to produce output voltage, the input soft start current will be 50/60 Hz sinusoidal for AC inputs, or a ramp in the case of DC input. For most input fault conditions, the current causes the internal BPR input protection fuses to open. For most output load faults, the current (after the initial AC application inrush) will not exceed the maximum steady-state values. This condition is when the BPR is operating in output current limit. Maximum input current with the −350V and 6V at maximum loading are typically less then or equal to 38 A RMS balanced three-phase with a balanced AC input voltage of 428 volts. Under these conditions, the input current to each rectifier should be less then 22 A RMS single phase. Input current should generally be limited to 58 A RMS maximum by the BPR subassembly (33.5 A RMS per rectifier).

In the case of DC inputs, the maximum input current with the −350V and 6V at maximum loading should be less then or equal to 66 A at 437VDC. Under these conditions the input current to each of the three rectifiers should be less then 22 A. System application conditions should generally prevent input currents from exceeding maximum input currents. In at least one embodiment, each rectifier is protected by one 30 A, 600V fast-acting semiconductor fuses on each of the AC input phases.

Each rectifier is configured to switch over to processing power from a normally disabled phase if a loss occurs on one of the normally active phases. Loss of any phase will also result in a phase fault indication in that rectifier. Loss of voltage on the normally disabled phase has no effect on input power processing provided the other active phases are present. Each rectifier is designed to start under a single phase condition provided the line voltage is within the steady-state operating requirements. In one or more embodiments, software is employed to control the operation of connection C. The BPR subassembly 110 is configured to operate error free during a battery discharge condition when operating off DC input.

Heat dissipated in the BPR subassemblies is primarily through a water cooled cold plate. In general, heat load to air should not exceed 250 Watts under non-fault conditions. Due to the BPR subassemblies modular design, a power on of only some of the power stages may be permitted to support lesser loads. Typically, low-power modes should keep the main housekeeping supply 710 off to eliminate the power required for the controls of two of the three rectifiers and their associated DC/DC converters. With a single DC/DC converter turned on and operated at up to 1.5 A of output current, the BPR subassembly 110 should generally be able to operate indefinitely without water cooling.

In various embodiments, the output of the BPR subassembly 110 is magnetically isolated from the high voltage input and controls and is floating with respect to the green wire ground. The +6V output is magnetically isolated from the AC input and is considered a SELV output. Each of the DC/DC converters has a diode in its power path before the output connector to prevent internal output fault shorts from affecting the common bus for parallel N+1 redundant applications. Output sharing between up to twelve parallel BPR subassemblies may be accomplished by impedance matching. This results in the output voltage having a negative slope characteristic as output current is increased. In at least one embodiment, voltage regulation ensures that BPR subassemblies operating in parallel share within about ±7.5 amps of the average current of all regulators in operation when using software adjustments.

DC/DC converters in the same group share a common regulation reference and voltage error signal with a current mode loop for each power stage. As a result DC/DC converters in the same group typically share current to within about ±0.63 amps of the average current for the group. Each of the three DC/DC groups output voltage may be configured to be individually adjustable via software. For example, the BPR subassembly 110 may be configured to maintain its output voltage at 350 volts ±15V for any combination of the following conditions (voltage regulation is measured at the output terminals of the BPR subassembly 110): static input voltage changes within the steady-state operating range; error free power line disturbances; transient load changes (steps); and variations within converter's operating environment.

'Sparing' refers to the ability of a product to continue to provide partial function in the event portions of the product fail. In the case of the BPR subassembly 110, the system application leverages the modular power trains to perform sparing. In at least one embodiment, the BPR subassembly 110 allows operation at reduced power levels in the event one or more rectifier front-ends or DC/DC converters is defective. While operating under these conditions, the output application current should be reduced (e.g., by 6.3 A for each DC/DC converter not operational. In the disclosed embodiment, it should be appreciated that one failed rectifier causes a group of four DC/DC converters to be non-operational. In general, current derating with input voltage may be applied to the lower capacity while operating in this mode.

In at least one embodiment, the +6V floating level (which is used for EPO coil(s) pick voltage) should be present within no more than three seconds after input voltage is applied to the BPR subassembly 110. In a typical design, the +6V level should maintain regulation of 5.9V to 7.8V for a DC load current range of 0 to 0.5 A under non-fault conditions. The fundamental voltage ripple on the +6V should generally not exceed 60 mV peak-to-peak. +BPR NBL energizes the relay that mechanically applies internal bias to the DC/DC control circuitry. Without this bias voltage, the 350V output cannot be enabled and this feature allows the BPR subassembly output voltage to be mechanically disabled for UEPO safety requirements. Once the pick voltage is applied, the 350V output can be turned on. When pick voltage is removed the BPR output voltage will be turned off within 10 mS and then start to decay. The rate of decay is dependent on the load.

The BPR subassembly 110 may include an amber LED labeled as "Identify" and a green LED labeled as "BPR Good" that is readily visible when inserted into a BPA. These LEDs may be managed by the host microcontroller 708. In one or more embodiments, the BPR subassembly 110 includes a full-duplex RS-422 interface that allows for control and monitoring from the BPC motherboard 118 and connects to the host microcontroller 708. Each rectifier includes a primary control board 712. The primary control board 712 includes circuitry (including a rectifier microcontroller) to operate the rectifier power train and includes an ancillary microcontroller that reports to the host microcontroller 708. Each of the primary control boards 712 are referenced to different voltages on the input voltage mains.

In at least one embodiment, the rectifier microcontroller includes the following signal connections: PrimeVoltsA; PrimeVoltsP; ACAmps; BulkV; IBBW, IBBX, IBBY, and IBBZ; TP; TempDiode; TempB+B; Bulk Adj; Line Fault; AMUX0, AMUX1, AMUX2; T/OnW#, T/OnX#, T/OnY#, T/onZ#; SCRNb1; Crowbar; Xmit; Rcv; and HOV.

PrimeVoltsA corresponds to the voltage of the three-phase input connections connected to a three-phase full-wave diode bridge. PrimeVoltsP corresponds to the peak voltage of the three-phase input connected to a three-phase full-wave diode bridge. ACAmps is the scaled line current into the rectifier. Bulk V is the scaled voltage at the output of the rectifier; IBBW, IBBX, IBBY, and IBBZ indicate the relative current through each of the buck+boost inductors. TP is the scaled highest output voltage of the housekeeping supply that powers the secondary control board 714. TempDiode is the temperature of the cooling block for the input diode bridge measured with a thermistor. TempB+B is the higher temperature of the cooling blocks for the buck or boost switches measured with a thermistor. Bulk Adj (which may be is a 2 KHz PWM signal) is used to adjust the regulation point of the rectifier output voltage.

Line Fault is used to indicate whether a line fault has occurred (e.g., if the instantaneous voltage of a full-wave three-phase bridge off the input is above 212 Volts ±5%) and is used to determine whether to fire the SCRs 802 and 804; AMUX0, AMUX1, and AMUX2 form the address in standard binary form for the analog multiplexer with AMUX0 as the least significant bit. T/OnW#, T/OnX#, T/OnY#, and T/onZ# indicate whether an associated phase of the input rectifier is turned on. SCRNb1 controls whether the SCRs on the input diode bridge are activated. Crowbar, when high, indicates the boost switches in the rectifier should turn on until the input current protection causes power to be removed from the rectifier input; Xmit and Rcv are used to form a full-duplex UART connection to the host microcontroller 708; and HOV indicates whether a hardware overvoltage has been detected on the output bulk voltage.

In the disclosed embodiment, each of the group of DC/DC converters 704 includes a secondary control card 714 that includes circuitry (e.g., a DC/DC group microcontroller) to operate the DC/DC power trains of the converters 704. The card 714 includes one ancillary microcontroller that reports to the host microcontroller 704. The secondary control boards 714 are referenced to the common positive rail of the DC/DC converter output power buses. In at least one embodiment, the DC/DC group microcontroller includes the following signal connections: TempDCW, TempDCX, TempDCY, and TempDCZ; T/OnW, T/OnX, T/OnY, and T/OnZ; VoAdj; IsnsAdj; IlimAdj; TempDCA; ISW, ISX, ISY, and ISZ; HOV; AMUX0, AMUX1, and AMUX2; Xmit; and Rcv.

TempDCW, TempDCX, TempDCY, and TempDCZ correspond to temperatures of the cooling block for the output diode bridges of the respective DC/DC converters measured with a thermistor. T/OnW, T/OnX, T/OnY, and T/OnZ are controlled by a master turn on bit which determines whether all DC/DC converters are on. VoAdj (which may be a 57 KHz PWM signal) is used to adjust the regulation point of all of the DC/DC converters. IsnsAdj (which may be a 57 KHz PWM) is used to null the offset of the Tout signal. IlimAdj (which may be a 57 KHz PWM signal) is used to adjust the current limit point of all of the DC/DC converters.

TempDCA measures the local air temperature of the secondary control card 714 via a connection to a temperature sensor powered from AVCC. ISW, ISX, ISY, and ISZ are signals whose values are proportional to the average primary current of the respective DC/DC converters. HOV indicates whether a hardware (i.e. fast) overvoltage has been detected on the output bus. AMUX0, AMUX1, and AMUX2 form the address in standard binary form for the analog multiplexer with AMUX0 as the LSB. Xmit and Rcv form a full-duplex UART connection to the host microcontroller 708. The host microcontroller 708 aggregates and acts on the information from the six ancillary microcontrollers (i.e., the rectifier microcontrollers and the DC/DC group microcontrollers).

Accordingly, a number of techniques have been disclosed herein that readily facilitate implementation of a power conversion, control, and distribution system for a high performance computing (HPC) cluster or clusters.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," (and similar terms, such as includes, including, has, having, etc.) are open-ended when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having thus described the invention of the present application in detail and by reference to preferred embodiments thereof, it will be apparent that modifications and variations are possible without departing from the scope of the invention defined in the appended claims.

What is claimed is:

1. A bulk power assembly, comprising:
multiple bulk power regulator (BPR) subassemblies each configured to generate DC bulk power from both AC input power and DC input power;
a bulk power distribution (BPD) subassembly coupled to the multiple BPR subassemblies, wherein the BPD subassembly includes respective static circuit breakers that are used to control and distribute the DC bulk power to respective outputs and configured to receive power from respective bias supplies, and wherein the BPD subassembly includes respective microcontrollers that each sense a different one of the static circuit breakers and receive power from a different one of the bias supplies such that a failure of any one of the bias supplies does not entirely disable the BPD subassembly; and
a bulk power controller and hub (BPCH) subassembly coupled to the BPD subassembly, wherein the BPCH subassembly is configured to monitor and control the BPD subassembly.

2. The bulk power assembly of claim 1, wherein each of the BPR subassemblies includes multiple electrically identical power converter sections.

3. The bulk power assembly of claim 2, wherein each of the multiple electrically identical power converter sections includes a rectifier front-end and a group of DC/DC converters.

4. The bulk power assembly of claim 3, wherein respective outputs of DC/DC converters included within the group of DC/DC converters are electrically connected to form an output power bus.

5. The bulk power assembly of claim 3, wherein each of the BPR subassemblies includes a relay that is controlled to disable the group of DC/DC converters.

6. The bulk power assembly of claim 3, wherein the rectifier front-end includes a single phase AC/DC converter that performs resistive emulation for AC power inputs.

7. The bulk power assembly of claim 3, wherein the rectifier front-end functions as a buck plus boost converter with four interleaved sections.

8. The bulk power assembly of claim 3, wherein the group of DC/DC converters includes four DC/DC converters that are configured to provide galvanic isolation from an input line, and wherein each output of the four DC/DC converters includes an ORing diode that prevents a fault on one or more of the four DC/DC converters from rendering remaining ones of the four DC/DC converters inoperable.

9. A bulk power assembly, comprising:

multiple bulk power regulator (BPR) subassemblies each configured to generate DC bulk power from both AC input power and DC input power, wherein each of the BPR subassemblies includes multiple electrically identical power converter sections that each include a rectifier front-end that function as a buck plus boost converter with four interleaved sections and a group of DC/DC converters;

a bulk power distribution (BPD) subassembly coupled to the multiple BPR subassemblies, wherein the BPD subassembly is configured to distribute the DC bulk power; and a bulk power controller and hub (BPCH) subassembly coupled to the BPD subassembly, wherein the BPCH subassembly is configured to monitor and control the BPD subassembly.

* * * * *